United States Patent
Ray et al.

(10) Patent No.: US 9,296,861 B2
(45) Date of Patent: Mar. 29, 2016

(54) POLYMERIZATION METHOD AND PRODUCT

(75) Inventors: Sudip Ray, Auckland (NZ); Allan James Easteal, Auckland (NZ); Ralph Cooney, legal representative, Mt. Eden (NZ)

(73) Assignee: AUCKLAND UNISERVICES LIMITED, Auckland (NZ)

( * ) Notice: Subject to any disclaimer, the term of this patent is extended or adjusted under 35 U.S.C. 154(b) by 44 days.

(21) Appl. No.: 14/110,052

(22) PCT Filed: Mar. 27, 2012

(86) PCT No.: PCT/NZ2012/000047
§ 371 (c)(1),
(2), (4) Date: Dec. 24, 2013

(87) PCT Pub. No.: WO2012/138234
PCT Pub. Date: Oct. 11, 2012

(65) Prior Publication Data
US 2014/0155571 A1    Jun. 5, 2014

(30) Foreign Application Priority Data
Apr. 5, 2011 (NZ) .......................... 592081

(51) Int. Cl.
*C08G 73/02* (2006.01)
*C08J 7/04* (2006.01)
*H01B 1/02* (2006.01)
*H05K 3/10* (2006.01)
*C08G 73/06* (2006.01)

(52) U.S. Cl.
CPC ............... *C08G 73/0266* (2013.01); *C08J 7/04* (2013.01); *H01B 1/026* (2013.01); *H05K 3/105* (2013.01); *C08G 73/0611* (2013.01); *C08J 2379/02* (2013.01)

(58) Field of Classification Search
CPC .......... H01B 1/026; H05K 3/105; C08J 7/04; C08J 2379/02; C08G 73/0266; C08G 73/0611
See application file for complete search history.

(56) References Cited

U.S. PATENT DOCUMENTS

| | | | |
|---|---|---|---|
| 5,932,144 A | 8/1999 | Shimizu et al. | |
| 6,136,909 A * | 10/2000 | Liao et al. | 524/446 |
| 7,374,703 B2 | 5/2008 | Epstein et al. | |
| 2004/0110051 A1* | 6/2004 | Srinivas | H01M 4/8605 252/500 |

FOREIGN PATENT DOCUMENTS

WO    WO 2009/041837 A1    4/2009

OTHER PUBLICATIONS

Yan H., et al. "Novel Syntheses of poly(o-aminobenzoic acid) and copolymers of o-aminobenzoic acid and aniline as potential candidates for precursors of polyaniline." Bull.Chem.Soc.Jpn., (1996) vol. 69, pp. 2395-2401.
International Search Report prepared by the Australian Patent Office on Jun. 15, 2012, for International Application No. PCT/NZ2012/000047.

* cited by examiner

*Primary Examiner* — Gregory Listvoyb

(57) ABSTRACT

Methods of preparing a polyaniline homopolymer or copolymer comprising at least one carboxylic acid group, and homopolymers or copolymers arising therefrom, the methods comprising: preparing a solution of a polyaniline precursor having at least one aromatic amine group and at least one carboxylic acid group (eg. 2-aminobenzoic acid, 3-aminobenzoic acid or 4-aminobenzoic acid) in a solvent selected from aqueous methanesulfonic acid or aqueous ammonia and optionally one or more additional polyaniline precursors (such as aniline); and oxidatively polymerising the polyaniline precursor or precursors.

11 Claims, No Drawings

POLYMERIZATION METHOD AND PRODUCT

CROSS REFERENCE TO RELATED APPLICATIONS

This application is a national stage application under 35 U.S.C. 371 and claims the benefit of PCT Application No. PCT/NZ2012/000047 having an international filing date of 27 Mar. 2012, which designated the United States, and which PCT application claimed the benefit of New Zealand Patent Application No. 592081 filed on 05 Apr. 2011, the entire disclosure of each is incorporated by reference herein.

TECHNICAL FIELD

The invention relates to processes for preparing polymers that include aminobenzoic acid monomers, and to copolymers and homopolymers prepared by those processes.

BACKGROUND ART

Polymers of aniline and its derivatives are useful as antimicrobial agents and have good antistatic and free radical scavenging properties. These properties make them useful for the manufacture of antimicrobial, antistatic and antioxidant objects, and suitable for use in, for example, the health, food, packaging, water, paint, wood, textile, poultry, glass, paper, rubber, ceramic, seafood, sports, plastic and agricultural industries.

Adding substituents to polyaniline (PANI) is one way in which the various properties of the polymer can be improved. However, the synthesis of substituted PANIs is not always a straightforward matter. Any substituent introduced to the aniline building block needs to be compatible with the reagents used, which is not always possible under the traditionally robust oxidative polymerisation conditions used to form PANIs.

Carboxylated PANIs are one type of PANI derivative of particular interest due to their good antibacterial properties. Carboxylated PANIs can either be homopolymers, which could also be described as a poly(aminobenzoic acid) (poly ABAs) or copolymers, which could be considered as a PANI backbone bearing carboxylic acid groups on some of the aromatic rings. Figure 1 shows the probable structure of poly (2-aminobenzoic acid) and poly(3-aminobenzoic acid). Figure 2 shows the probable structure of copolymers of aniline and 2-aminobenzoic acid or 3-aminobenzoic acid, where X and Y are the numbers of repeat units.

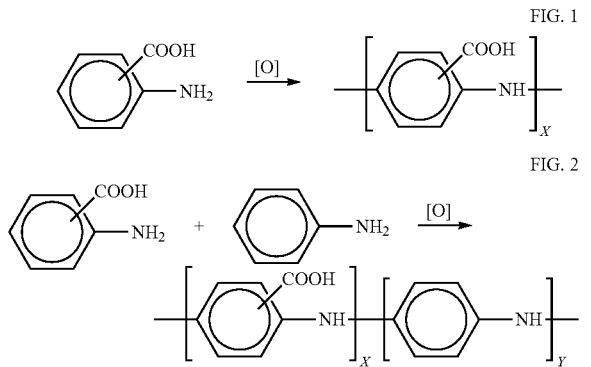

FIG. 1

FIG. 2

However, producing PANI homopolymers and copolymers from aminobenzoic acid (ABA) monomers in good yield and purity is not a simple procedure. There are significant problems with the solubilities of ABAs. ABAs tend to be solids, unlike aniline itself or many substituted anilines (alkyl anilines like toluidine, alkoxy anilines like anisidine etc) which can be used directly in their liquid form. This low solubility impacts upon the cost of synthesis and the quality of the resultant polymers.

There thus exists a need to produce poly-ABAs (carboxylated PANIs) in high yield and in a cost effective manner, with high conversion of monomer units, short production time and high molecular weights.

It is an object of the present invention to overcome or ameliorate at least one of the disadvantages of the prior art, or to provide a useful alternative.

SUMMARY

In a broad aspect, the invention provides a method of preparing a polyaniline homopolymer or copolymer comprising at least one carboxylic acid group; the method comprising:
preparing a solution of a polyaniline precursor having at least one aromatic amine group and at least one carboxylic acid group in a solvent selected from aqueous methanesulfonic acid or aqueous ammonia and optionally one or more additional polyaniline precursors; and
oxidatively polymerising the polyaniline precursor or precursors.

Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

In one aspect, the invention provides a method of preparing a polyaniline homopolymer comprising carboxylic acid groups; the method comprising:
preparing a solution of a polyaniline precursor having at least one aromatic amine group and at least one carboxylic acid group in aqueous methanesulfonic acid; and
oxidatively polymerising the polyaniline precursor having at least one aromatic amine group and at least one carboxylic acid group.

In one aspect, the invention provides a method of preparing a polyaniline homopolymer comprising carboxylic acid groups; the method comprising:
preparing a solution of a polyaniline precursor having at least one aromatic amine group and at least one carboxylic acid group in aqueous ammonia; and
oxidatively polymerising the polyaniline precursor having at least one aromatic amine group and at least one carboxylic acid group.

The polyaniline precursor having at least one aromatic amine group and at least one carboxylic acid group may be any aromatic ring bearing —$NH_2$ and —COOH moieties in any position, with or without other substituents. In certain preferred embodiments, the substance being polymerised is selected from 2-aminobenzoic acid, 3-aminobenzoic acid or 4-aminobenzoic acid.

Monomers other than amino benzoic acids can be used, for example aniline or pyrrole, or derivatives thereof may be used.

In one aspect, the invention provides a method of preparing a polyaniline copolymer comprising at least one carboxylic acid group; the method comprising:
preparing a solution of a polyaniline precursor having at least one aromatic amine group and at least one carboxylic acid group in aqueous methanesulfonic acid and one or more additional polyaniline precursors; and
oxidatively polymerising the polyaniline precursor having at least one aromatic amine group and at least one carboxylic acid group and the one or more additional polyaniline precursors.

In one aspect, the invention provides a method of preparing a polyaniline copolymer comprising at least one carboxylic acid group; the method comprising:

preparing a solution of a polyaniline precursor having at least one aromatic amine group and at least one carboxylic acid group in aqueous ammonia and one or more additional polyaniline precursors; and oxidatively polymerising the polyaniline precursor having at least one aromatic amine group and at least one carboxylic acid group and the one or more additional polyaniline precursors.

The polyaniline precursor having at least one aromatic amine group and at least one carboxylic acid group may be any aromatic ring bearing —$NH_2$ and —COOH moieties in any position, with or without other substituents. In certain preferred embodiments, the substance being polymerised is selected from 2-aminobenzoic acid, 3-aminobenzoic acid or 4-aminobenzoic acid. The one or more additional polyaniline precursors may be any amino substituted aromatic ring, which is in some cases preferably comprises aniline.

Figure 3 shows a possible structure of poly(4-aminobenzoic acid).

FIG. 3

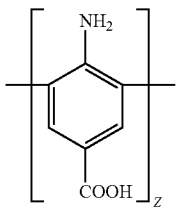

Monomers other than amino benzoic acids can be used, for example aniline and other derivatives thereof or pyrrole and derivatives thereof may be used.

The most preferred copolymers are those formed from mixtures of aniline and 2-aminobenzoic acid, aniline and 3-aminobenzoic acid or aniline and 4-aminobenzoic acid. Figure 4 shows a possible structure of copolymers of aniline and 4-aminobenzoic acid. Y and Z are the numbers of repeat units.

FIG. 4

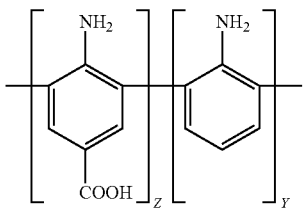

The ratio of the polyaniline precursor having at least one aromatic amine group and at least one carboxylic acid group: the one or more additional polyaniline precursors is from 99:1 to 1:99. Alternatively, ratios in the range 72:25 to 25:75 may be used.

If aqueous methane sulfonic acid is used, it is preferably in a concentration of 0.1 to 10 M in water. It is generally preferred if the ratio of concentration of ABA to methanesulfonic acid is from 2:1 to 1:2. For example, it is preferred to use a solution of methanesulfonic acid of around 1 M and an ABA concentration of around 0.5 M.

The polyaniline precursor having at least one aromatic amine group and at least one carboxylic acid group is preferably dissolved in the aqueous methane sulfonic acid and oxidising agent is added. If a copolymer is desired, additional polyaniline precursors may be added in a suitable compatible solvent, which may include water or aqueous methane sulfonic acid.

If ammonia is used, the polyaniline precursor having at least one aromatic amine group and at least one carboxylic acid group is suspended in water and ammonia is added to dissolve it. The amount and concentration required can be readily determined. Typically, commercial strength ammonia is added to a suspension of the ABA in water until the monomer is dissolved. The pH is readily maintained at around neutral to slightly alkaline pHs, for example around pH 7-8.

The reaction of aminobenzoic acid and/or aniline to synthesize the homopolymer or copolymer is carried out in an acidic or near neutral medium in the presence of an oxidizing agent. Any suitable oxidizing agent may be used. Suitable oxidizing agents include, although are not limited to, ammonium persulphate, potassium ferricyanide, potassium iodate, hydrogen peroxide, cerium (IV) sulphate, potassium dichromate and sodium vanadate. For neutral/alkaline based reaction, preferably the oxidizing agent is ammonium persulphate or hydrogen peroxide.

The methods of the present invention will also usually further include the step of collecting the precipitated poly aminobenzoic acid homopolymer or copolymer by filtration.

DESCRIPTION

Aminobenzoic acids have low solubility in water and in common acids used to carry out oxidative polymerization. For example, 3-ABA has only around 5 wt% solubility in 1 M HCl, which is typical for ABAs generally. Even if the aminobenzoic acids can be dissolved to some extent, it is difficult to get them into solution at sufficiently high concentrations to achieve good yields of the resultant polyaniline polymer or copolymer. The present inventors have developed solvent systems based around methanesulfonic acid or ammonia that enable the monomer to be dissolved in MSA or ammonia at high concentration (15% by weight or higher)

The methods of the present invention enable the practical large scale production of PANIs, particularly those starting from amino benzoic acid derivatives, at room temperature. Because of the good solubility of the starting monomers, the reaction yield and starting monomer consumption is high and the reaction time is reduced, resulting in a less wasteful and more economic synthesis. Moreover, the products of the present invention have been found to have high molecular weight and, where copolymers are concerned, high incorporation of n-ABA in the resultant copolymer is observed.

COMPARATIVE EXAMPLES

Oxidative polymerisation of 3-amino benzoic acid to the corresponding polycarboxylated PANI was carried out under standard conditions using 1M HCl as monomer solvent and APS as oxidant.

From 150 ml 1 M HCl solution containing 2.2 g (16 mmol) 3-ABA, 0.0154 g polymer was obtained (0.7% yield*) when the reaction was performed at 10° C. for 7 days From 200 g 1 M HCl solution containing 10 g n-ABA monomer, 1 g polymer was obtained (10% yield*), when the reaction was performed at room temperature for 48 h

*Yield:=100×[mass of the polymer]/[mass of the (co)monomer(s)]

INVENTIVE EXAMPLES

Methane Sulphonic Acid as Solvent

Poly(n-amino benzoic acid) homopolymers, where n=2, 3 or 4 (P(n-ABA)) and poly(n-amino benzoic acid-co-aniline) copolymers (P(n-ABA-co-Ani)) were synthesised in 1 M methane sulfonic acid (MSA) at 25° C. (ambient temperature), with ammonium persulfate (APS) as the oxidizing agent. The monomer(s) concentration and the mole ratio of monomer(s) to APS were kept constant at 0.5 M and 1:1.25 respectively. The mole ratio of n-aminobenzoic acid (n-ABA) to aniline (Ani) in the comonomer mixtures was varied from 99:1 to 1:99, or more usually 75:25 to 25:75.

The maximum concentration of n-aminobenzoic acid (n-ABA) in 1 M MSA is about 15%, which may be higher in more concentrated MSA.

Homopolymers

Homopolymers of the present invention can be designated as follows:

HpMn: Hp=Homopolymer, M=methane sulfonic acid (MSA), n=position of —COOH functional group (4 or 3 or 2) in n-ABA precursor.

HpAn: Hp=Homopolymer, A=ammonia, n=position of —COOH functional group (4 or 3 or 2) in n-ABA precursor.

Synthesis of PANI homopolymers of aminobenzoic acids P(n-ABA): 13.86 g of 4-ABA was dissolved in 100 mL of 1 M MSA. 28.52 g of APS was dissolved in 100 mL of water and added dropwise to the monomer solution with constant stirring. Polymerisation was continued with stirring for 24 h. The polymeric product that precipitated from the solution was collected by filtration, washed thoroughly with distilled water then (vacuum) dried at 50° C. From this process 7.2 g polymer HpM4 was obtained (52% yield).

The yield can be seen to be significantly better than that obtained from the use of HCl as solvent.

The use of 3-ABA and 2-ABA in an identical manner resulted in the synthesis of a homopolymer of 3-aminobenzoic HpM3 and a homopolymer of 2-aminobenzoic acid HpM2 respectively.

Table 1 shows the properties of HpMn homopolymers synthesised using MSA as solvent. The yields are significantly better than using traditional solvents, such as HCl.

CpAnYZ: Cp=Copolymer, A=ammonia, n=position of —COOH functional group (4 or 3 or 2) in n-ABA precursor, YZ ratio Y:Z of n-ABA:aniline in feed.

Synthesis of copolymers of aminobenzoic acids and aniline P(n-ABA-co-Ani): For a typical synthesis of P(n-ABA-co-Ani) (starting from a solution with equimolar proportions of comonomers, for example), 6.94 g of n-ABA was dissolved in 100 mL of 1 M MSA. 4.66 g aniline was added to this solution and stirred for 15 mins. 28.52 g of APS was dissolved in 100 mL of water and added dropwise to the solution of the monomers with constant stirring. Polymerisation was continued with stirring for 24 h. The polymer product that precipitated from the solution was collected by filtration, washed thoroughly with distilled water then (vacuum) dried at 50° C.

Oxidative synthesis of copolymer CpM411: 6.94 g of 4-ABA was dissolved in 100 mL of 1 M MSA. 4.66 g aniline was added to this solution and stirred for 15 mins. 28.52 g of APS was dissolved in 100 mL of water and added dropwise to the solution of the monomers with constant stirring. Polymerisation was continued with stirring for 24 h. The polymer product that precipitated from the solution was collected by filtration, washed thoroughly with distilled water then (vacuum) dried at 50° C. From this process 11.6 g copolymer (CpM411) was obtained (100% yield).

Under similar conditions, copolymers of 4-ABA and aniline, copolymers of 3-ABA and aniline, copolymers of

TABLE 1

| Material | Monomer | Colour | Yield (%) | Mol wt. (g/mol) | Antimicrobial property (Minimum inhibitory concentration) % | | Free radical scavenging (µmol DPPH scavenged/mg of sample) % | Conductivity (S/cm) |
|---|---|---|---|---|---|---|---|---|
| | | | | | Gram +ve (S. aureus) | Gram −ve (E. coli) | | |
| HpM4 | 4ABA | Dark brown | 52 | 19826 | 0.5 | 1 | 64 | $<10^{-5}$ |
| HpM3 | 3ABA | Dark brown | 18 | 12947 | 1 | >2% | 60 | $<10^{-5}$ |
| HpM2 | 2ABA | Dark brown | 30 | 22200 | 0.25 | 1 | 61 | $<10^{-5}$ |

Copolymers

Copolymers of the present invention can be designated as follows:

CpMnYZ: Cp=Copolymer, M=methane sulfonic acid (MSA), n=position of —COOH functional group (4 or 3 or 2) in n-ABA precursor, YZ ratio Y:Z of n-ABA:aniline in feed.

2-ABA and aniline at various monomer feed ratio (from 99:1 to 1:99) can be synthesized.

Table 2 shows the properties of copolymers (CpMnYZ) synthesised in acidic medium.

TABLE 2

| Material | Monomer ratio (n-ABA:Aniline) | Colour | Yield (%) | Antimicrobial property (Minimum inhibitory concentration) % | | Free radical scavenging (micromoles of DPPH scavenged/mg of sample) % | Conductivity (S/cm) |
|---|---|---|---|---|---|---|---|
| | | | | Gram +ve (S. aureus) | Gram −ve (E. coli) | | |
| CpM431 | 4ABA:Aniline (3:1) | Dark brown | 78 | 0.25 | 2 | 57 | $<10^{-5}$ |

TABLE 2-continued

| Material | Monomer ratio (n-ABA:Aniline) | Colour | Yield (%) | Antimicrobial property (Minimum inhibitory concentration) % | | Free radical scavenging (micromoles of DPPH scavenged/mg of sample) % | Conductivity (S/cm) |
|---|---|---|---|---|---|---|---|
| | | | | Gram +ve (*S. aureus*) | Gram −ve (*E. coli*) | | |
| CpM411 | 4ABA:Aniline (1:1) | Dark brown | 100 | 0.5 | >2 | 59 | 0.002 |
| CpM413 | 4ABA:Aniline (1:3) | Dark green | 112 | 0.5 | >2 | 60 | 1 |
| CpM331 | 3ABA:Aniline (3:1) | Dark brown | 85 | 0.5 | 2 | 57 | $<10^{-5}$ |
| CpM311 | 3ABA:Aniline (1:1) | Dark brown | 101 | 2 | >2 | 54 | 0.002 |
| CpM313 | 3ABA:Aniline (1:3) | Dark green | 114 | >2 | >2 | 46 | 0.6 |
| CpM231 | 2ABA:Aniline (3:1) | Dark brown | 78 | 0.5 | 2 | 54 | $<10^{-5}$ |
| CpM211 | 2ABA:Aniline (1:1) | Dark brown | 81 | 0.5 | >2 | 47 | 0.04 |
| CpM213 | 2ABA:Aniline (1:3) | Dark green | 121 | 0.5 | >2 | 54 | 2 |

Ammonia as Solvent
Homopolymers

Synthesis of HpA4 in non-acidic medium (by neutralizing monomer with ammonia): 13.86 g monomer (4-ABA) was dissolved in 100 mL water by neutralizing with 7.5 mL of 28% ammonia. 28.52 g of APS was dissolved in 92.5 mL of water and added dropwise to the monomer solution with constant stirring. Polymerisation was continued with stirring for 24 h. The polymeric product that precipitated out from the solution was collected by filtration, washed thoroughly with distilled water then (vacuum) dried at 50° C. From this process 11.37 g polymer HpA4 was obtained (82% yield).

Again, the yield can be seen to be significantly better than that obtained from the use of HCl as solvent. Under the same conditions HpA3 and HpA2 can be synthesized in non-acidic medium (by neutralizing monomer with ammonia.)

Figure 5 below shows a possible reaction scheme for synthesis of poly(4-aminobenzoic acid).

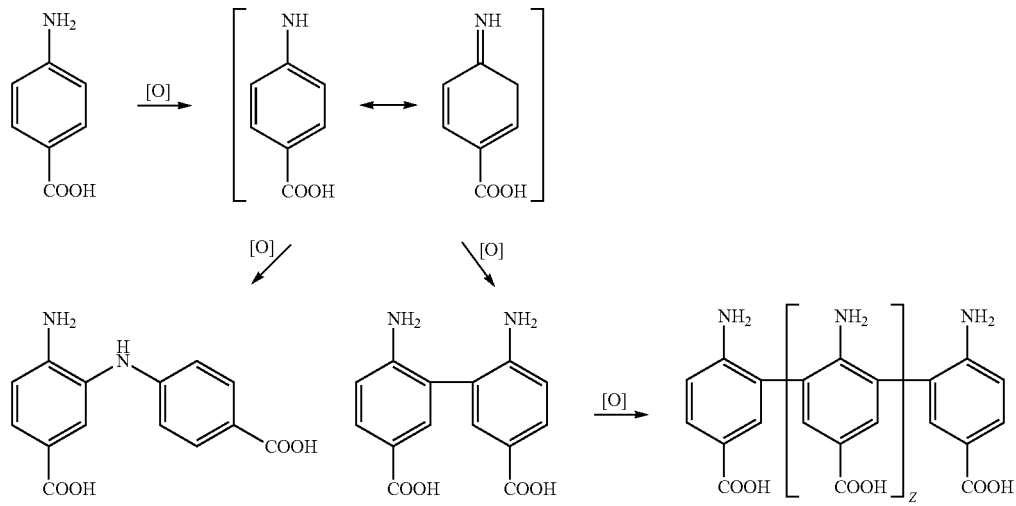

FIG. 5

Table 3 shows the properties of HpAn homopolymers synthesised by pre-neutralization with ammonia

TABLE 3

| Material | Monomer | Colour | Yield (%) | Mol wt (g/mol) | Antimicrobial property (Minimum inhibitory concentration) % | | Free radical scavenging (μmol DPPH scavenged/ mg of sample) % | Conductivity (S/cm) |
|---|---|---|---|---|---|---|---|---|
| | | | | | Gram +ve (S. aureus) | Gram −ve (E. coli) | | |
| HPA4 | 4ABA | Dark brown | 82 | 18362 | 0.125 | >2 | 55 | <10$^{-5}$ |
| HPA3 | 3ABA | Dark brown | 82 | 62847 | 1 | 2 | 61 | <10$^{-5}$ |
| HPA2 | 2ABA | Dark brown | 71 | 44645 | 0.5 | 1 | 56 | <10$^{-5}$ |

Copolymers

Oxidative synthesis of copolymer CpA411: 6.94 g monomer (4-ABA) was dissolved in 100 mL water by neutralizing with 4 mL of 28% ammonia. 4.66 g aniline was added to this solution and stirred for 15 mins. 28.52 g of APS was dissolved in 96 mL of water and added dropwise to the monomer solution with constant stirring. Polymerisation was continued with stirring for 24 h. The polymeric product that precipitated out from the solution was collected by filtration, washed thoroughly with distilled water then (vacuum) dried at 50° C. From this process 10.2 g copolymer (CpA411) was obtained (88% yield).

Under similar conditions, copolymers of (4-ABA) and aniline, (3-ABA) and aniline, and (2-ABA) and aniline at various monomer feed ratio (can be from 99:1 to 1:99) can be synthesized in acidic medium.

Table 4 shows a property chart of copolymers (CpAnYZ) synthesised by pre-neutralization of monomer n-ABA with ammonia.

The claims defining the invention are as follows:

1. A method of preparing a polyaniline homopolymer or copolymer comprising at least one carboxylic acid group, the method comprising:

preparing an acidic or near neutral (pH 7-8) solution of 15% by weight or higher of a first polyaniline precursor having at least one aromatic amine group and at least one carboxylic acid group in a solvent selected from the group consisting of aqueous methanesulfonic acid and aqueous ammonia;

wherein the solution optionally includes one or more additional polyaniline precursors; and oxidatively polymerising the polyaniline precursor an additional precursors, if present.

2. The method of claim 1, further comprising:

preparing the solution of the first polyaniline precursor in aqueous methanesulfonic acid; and oxidatively polymerising the polyaniline precursor.

TABLE 4

| Material | Monomer ratio (n-ABA:Aniline) | Colour | Yield (%) | Antimicrobial property (Minimum inhibitory concentration) % | | Free radical scavenging (micromoles of DPPH scavenged/mg of sample) % | Conductivity (S/cm) |
|---|---|---|---|---|---|---|---|
| | | | | Gram +ve (S aureus). | Gram −ve (E. coli) | | |
| CpA431 | 4ABA:Aniline (3:1) | Dark brown | 83 | 0.06% | >2% | 60 | <10$^{-5}$ |
| CpA411 | 4ABA:Aniline (1:1) | Dark brown | 88 | 0.13% | >2% | 58 | <10$^{-5}$ |
| CpA413 | 4ABA:Aniline (1:3) | Dark green | 90 | 0.25% | >2% | 55 | 0.0003 |
| CpA331 | 3ABA:Aniline (3:1) | Dark brown | 83 | 0.125 | >2 | 58 | <10$^{-5}$ |
| CpA311 | 3ABA:Aniline (1:1) | Dark brown | 87 | 0.125 | >2 | 61 | <10$^{-5}$ |
| CpA313 | 3ABA:Aniline (1:3) | Dark green | 85 | 0.25 | >2 | 55 | 0.00005 |
| CpA231 | 2ABA:Aniline (3:1) | Dark brown | 72 | 0.125 | 1 | 53 | <10$^{-5}$ |
| CpA211 | 2ABA:Aniline (1:1) | Dark brown | 91 | 0.125 | 2 | 52 | <10$^{-5}$ |
| CpA213 | 2ABA:Aniline (1:3) | Dark green | 93 | 0.25 | >2 | 56 | <10$^{-5}$ |

3. The method of claim 1, further comprising:
preparing a solution of the first polyaniline precursor in aqueous ammonia; and
oxidatively polymerising the polyaniline precursor.

4. The method of claim 1, further comprising:
preparing the solution of the first polyaniline precursor and the one or more additional polyaniline precursors in aqueous methanesulfonic acid; and
oxidatively polymerising the first polyaniline precursor and the one or more additional polyaniline precursors.

5. The method of claim 1, further comprising:
preparing the solution of the first polyaniline precursor and the one or more additional polyaniline precursors in aqueous ammonia; and
oxidatively polymerising the first polyaniline precursor and the one or more additional polyaniline precursors.

6. The method of claim 1, wherein the first polyaniline precursor having at least one aromatic amine group and at least one carboxylic acid group is selected from the group consisting of 2-aminobenzoic acid, 3-aminobenzoic acid, and 4-aminobenzoic acid.

7. The method of claim 1, wherein the one or more additional polyaniline precursors comprises aniline.

8. The method of claim 1, wherein the ratio of the first polyaniline precursor having at least one aromatic amine group and at least one carboxylic acid group: the one or more additional polyaniline precursors is from 99:1 to 1:99.

9. The method of claim 1, wherein the first polyaniline precursor and methanesulfonic acid are present in a ratio of 2:1 to 1:2.

10. The method of claim 1, wherein the polymerisation is carried out by APS.

11. The method of claim 1, further including the step of collecting precipitated polyaniline by filtration.

* * * * *